United States Patent
Kim

(10) Patent No.: US 7,466,597 B2
(45) Date of Patent: Dec. 16, 2008

(54) NAND FLASH MEMORY DEVICE AND COPYBACK PROGRAM METHOD FOR SAME

(75) Inventor: Hyung-Gon Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 128 days.

(21) Appl. No.: 11/020,549

(22) Filed: Dec. 22, 2004

(65) Prior Publication Data
US 2006/0050576 A1    Mar. 9, 2006

(30) Foreign Application Priority Data
Sep. 9, 2004   (KR) ...................... 10-2004-0072269
Sep. 9, 2004   (KR) ...................... 10-2004-0072270

(51) Int. Cl.
*G11C 11/34* (2006.01)
(52) U.S. Cl. .................... 365/185.28; 365/185.17; 365/202
(58) Field of Classification Search ............ 365/185.28, 365/201, 202, 185.33, 189.01, 185.17, 185.09, 365/233, 241
See application file for complete search history.

(56) References Cited

U.S. PATENT DOCUMENTS

| | | | | |
|---|---|---|---|---|
| 6,373,748 | B2 * | 4/2002 | Ikehashi et al. ......... | 365/185.22 |
| 6,680,870 | B2 | 1/2004 | Toyama et al. | |
| 2003/0076719 | A1 * | 4/2003 | Byeon et al. ................ | 365/200 |
| 2003/0117846 | A1 * | 6/2003 | Hasegawa et al. ...... | 365/185.09 |
| 2003/0133340 | A1 * | 7/2003 | Lee ............................ | 365/200 |
| 2004/0202034 | A1 * | 10/2004 | Lee ............................ | 365/202 |
| 2005/0120163 | A1 * | 6/2005 | Chou et al. ................. | 711/103 |
| 2005/0157563 | A1 * | 7/2005 | Lin et al. ............... | 365/189.01 |
| 2005/0172065 | A1 * | 8/2005 | Keays ........................ | 711/103 |
| 2005/0289314 | A1 * | 12/2005 | Adusumilli et al. ......... | 711/168 |

FOREIGN PATENT DOCUMENTS

| | | |
|---|---|---|
| JP | 2003-296199 | 10/2003 |
| KR | 2000-0035866 | 6/2000 |
| KR | 2001-0067139 | 7/2001 |
| KR | 2003-0048438 | 7/2003 |

OTHER PUBLICATIONS

English language abstract of Japanese Publication No. 2003-296199.
English language abstract of Korean Publication No. 2000-0035866.
English language abstract of Korean Publication No. 2001-0067139.
English language abstract of Korean Publication No. 2003-0048438.

* cited by examiner

*Primary Examiner*—Dang T Nguyen
(74) *Attorney, Agent, or Firm*—Marger Johnson & McCollom, P.C.

(57) ABSTRACT

A NAND flash memory device according to some embodiments includes a cell array, a page buffer configured to copyback read the data in the cell array, and an error detector for detecting errors that occur during the copyback reading and for generating a detection signal. Detecting errors is performed concurrently with a copyback program operation and completes before finishing a copyback program verify operation. The data stored in the page buffer may be copyback programmed when the detection signal is a pass signal. The copyback operation may end without executing the copyback program operation when the detection signal is a fail signal. Since the copyback program operation and the error detection operation are performed concurrently, the errors occurring during the copyback operation may be detected without additional time delay. Additionally, occurrence of two-bit error may be prevented because the copyback program is not executed when the fail signal is generated.

44 Claims, 3 Drawing Sheets

NAND FLASH MEMORY DEVICE AND COPYBACK PROGRAM METHOD FOR SAME

CROSS-REFERENCE TO RELATED APPLICATIONS

This U.S. non-provisional patent application claims priority under 35 U.S.C. § 119 to Korean Patent Applications 2004-72269 and 2004-72270, both filed on 9 Sep. 2004, the contents of which are hereby incorporated by reference in their entirety for all purposes.

BACKGROUND OF THE INVENTION

This disclosure relates to a NAND flash memory device, and more specifically, to a NAND flash memory device that may detect errors during a copyback program, and a copyback program method thereof.

A NAND flash memory device is a semiconductor memory device that is used for storing data to read whenever it is required. The NAND flash memory is a nonvolatile memory device that is capable of maintaining data even when a power supply is cut off.

The NAND flash memory device includes a number of memory cells having a string structure. An organization of these memory cells is called a 'cell array'. In the NAND flash memory device, the cell array is divided into a number of blocks and each block is divided into a number of pages. Each page includes a number of memory cells that share one word line.

The NAND flash memory device performs read and write operations by units of pages and an erase operation by units of blocks. The NAND flash memory device also supports "copyback" operations in addition to read, write, and erase operations. A copyback operation is one where data that is stored in a first page (or a source page) is moved to a second page (or a target page). Generally, copyback operations may include a copyback read operation, a copyback program operation, and a copyback program verify operation.

A copyback read operation reads data stored in a source page and stores it in a page buffer. A copyback program operation re-programs the data stored in the page buffer to the target page directly without reading the data out. A copyback program verify operation confirms whether data is correctly programmed to the target page. Using the copyback operations described above, the process of reading out data stored in the page buffer and loading the external data to the page buffer may be omitted to speed up the operation of the NAND flash memory device.

However, when copyback operations are carried out, a one-bit error may occur during the copyback read operation, and an additional one-bit error may occur during the copyback program operation and the copyback program verify operation. Therefore, two-bit errors may occur after the copyback operation. A memory controller in a general NAND flash memory device may correct only one-bit of error per page. Thus, copyback operations that cause two-bit errors in one page cannot be completely corrected.

Accordingly, one conventional method for preventing the occurrence of a two-bit error is to detect whether an error occurs in data stored to a page buffer from a source page by a copyback read operation. However, to stop the copyback operation in this manner and detect the error requires an additional time delay, so that the method has the undesirable tendency to decrease the high speed of the NAND flash memory.

Embodiments of the invention address these and other disadvantages of the conventional art.

SUMMARY OF THE INVENTION

Some embodiments of the invention include a NAND flash memory device capable of detecting errors occurring during a copyback operation without additional time delay. Other embodiments of the invention include a NAND flash memory device capable of preventing two-bit error in one page by ending a copyback program operation when error occurs during a copyback operation.

BRIEF DESCRIPTION OF THE DRAWINGS

The accompanying drawings are included to provide a further understanding of the invention, and are incorporated in and constitute a part of this specification. The drawings illustrate example embodiments of the invention and, together with the description, serve to explain principles of the invention.

DETAILED DESCRIPTION OF THE INVENTION

Specific embodiments of the invention will be described below in more detail with reference to the accompanying drawings. The invention may, however, be embodied in many different forms and should not be construed as limited only to the specific embodiments set forth below. Rather, these embodiments are provided so that this disclosure will be thorough and complete, and will fully convey the scope of the invention to those skilled in the art. In the specification, like numerals refer to like elements throughout.

Figure 1:
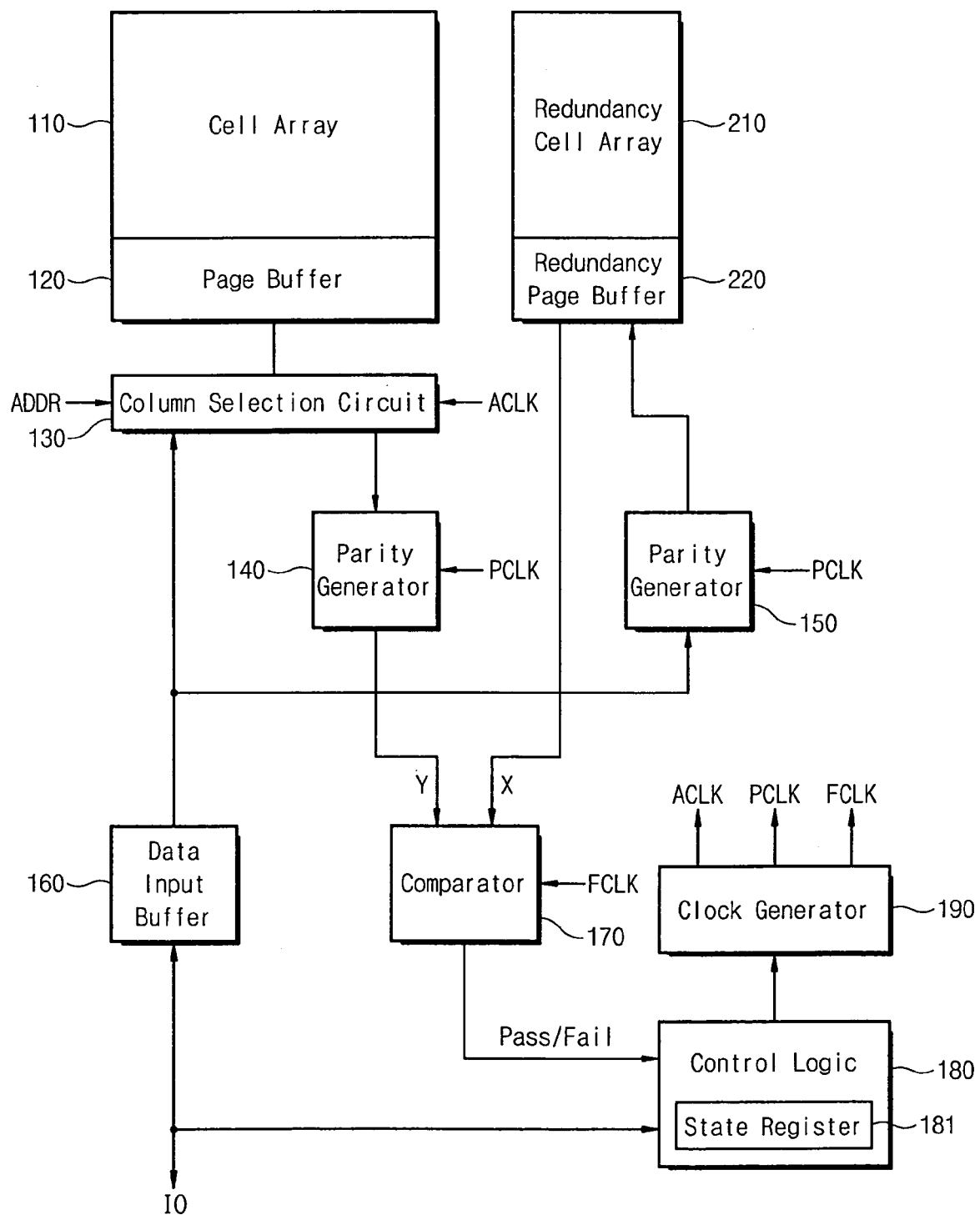
FIG. 1 is a block diagram illustrating a NAND flash memory device in accordance with some embodiments of the invention.

FIG. 1 is a block diagram illustrating a NAND flash memory device in accordance with some embodiments of the invention. Referring to FIG. 1, the NAND flash memory device 100 includes a cell array 110, a page buffer 120, a column selection circuit 130, parity generators 140 and 150, a data input buffer 160, a comparator 170, a control logic 180, a clock generator 190, a redundancy cell array 210, and a redundancy page buffer 220.

The data input buffer 160 receives data through an input/output line IO. The data is usually input in units of one byte or one word. In this case, one byte is eight bits and one word is sixteen bits. The data input buffer 160 provides the input data for the column selection circuit 130 and the first parity generator 150.

The column selection circuit 130 transmits the data provided from the data input buffer 160 to the page buffer 120 in response to a column address ADDR and an address clock signal ACLK. The column address ADDR is externally provided and then decoded by a column decoder (not shown) of the column selection circuit 130. The decoded address signal turns on a transistor of a Y-gate circuit (not shown) in the column selection circuit 130. The address clock signal ACLK drives an address counter (not shown) of the column selection circuit 130 to increase the column address in serial order. The data provided from the data input buffer 160 is input to the page buffer 120 via the column selection circuit 130 by these operations. The column decoder, the Y-gate circuit, and the address counter inside the column selection circuit 130 are well known to those skilled in the art and will not be explained in further detail.

Meanwhile, the first parity generator 150 receives the data provided from the data input buffer 160 to generate an error detection code EDC. The error detection code generated from the first parity generator 150 is defined as a first parity. The first parity generator 150 generates the first parity having one-bit error information on data of a first page inputted in synchronization with a parity clock signal PCLK. The first parity generator 150 provides the first parity for the redundancy page buffer 220.

The page buffer 120 and the redundancy page buffer 220 store the inputted data and the first parity temporarily. The data and the first parity are programmed in each source page of the cell array 110 and a redundancy cell array 210, respectively.

Although it is not shown in FIG. 1, the cell array 110 is divided into blocks, each block including a number of pages, and each page including a number of memory cells sharing one word line. Generally, for instance, each block includes 16, 32, or 64 numbers of pages and each page includes 512-byte or 64-byte numbers of memory cells.

The data that is programmed in source pages of the cell array 110 and the redundancy cell array 210 are re-stored in the page buffer 120 and the redundancy page buffer 220 by a copyback read operation. In this case, one-bit errors may occur in reading data programmed in the source page of the cell array 110.

The data stored in the page buffer 120 and the redundancy page buffer 220 are copyback programmed in target pages of the cell array 110 and the redundancy cell array 210. In this case, while the data stored in the page buffer 120 is copyback programmed in the target page, the data stored in the page buffer 120 is input to a second parity generator 140 via the column selection circuit 130.

The second parity generator 140 generates an error detection code EDC in the same operation as the first parity generator 150 performed. The error detection code generated from the second parity generator 140 is defined as a second parity. The second parity is generated in synchronization with a parity clock signal PCLK, and the second parity Y is sent to the comparator 170.

The comparator 170 compares the second parity Y from the second parity generator 140 with the first parity X from the redundancy page buffer 220 to generate a detection signal. If a failure does not occur, the first parity X and the second parity Y will have the same value. In this case, the comparator 170 generates a pass signal Pass in synchronization with a clock signal FCLK. If a failure occurs so that the first parity X and the second parity Y are not identical, the comparator 170 generates a fail signal Fail in synchronization with the clock signal FCLK. The pass signal or the fail signal is then sent to the control logic 180.

The control logic 180 includes a state register 181. The state register 181 stores the pass signal or the fail signal provided from the comparator 170. The pass signal or the fail signal stored in the state register 181 is externally output through an input/output line IO. Meanwhile, the control logic 180 controls various operations of the NAND flash memory device 100. Especially when the comparator 170 receives the fail signal, the page buffer 120 is controlled not to perform a copyback program.

The clock generator 190 is controlled by the control logic 180 and generates an address clock signal ACLK for driving an address counter (not shown) of the column selection circuit 130, a parity clock signal PCLK for generating first and second parities from the first and second parity generators 140 and 150, and a clock signal FCLK for generating a pass signal or a fail signal from the comparator 170.

The NAND flash memory device 100 of the present invention generates a first parity when the data is inputted, and stores the first parity in a redundancy cell array 210. The NAND flash memory device 100 generates the second parity and compares it with the first parity so as to detect an error occurring during a copyback read operation. If the first and second parities are identical, the copyback program is normally performed. However, if the first and second parities are not identical, the copyback program is not executed further and the copyback operation is ended.

Figure 2:
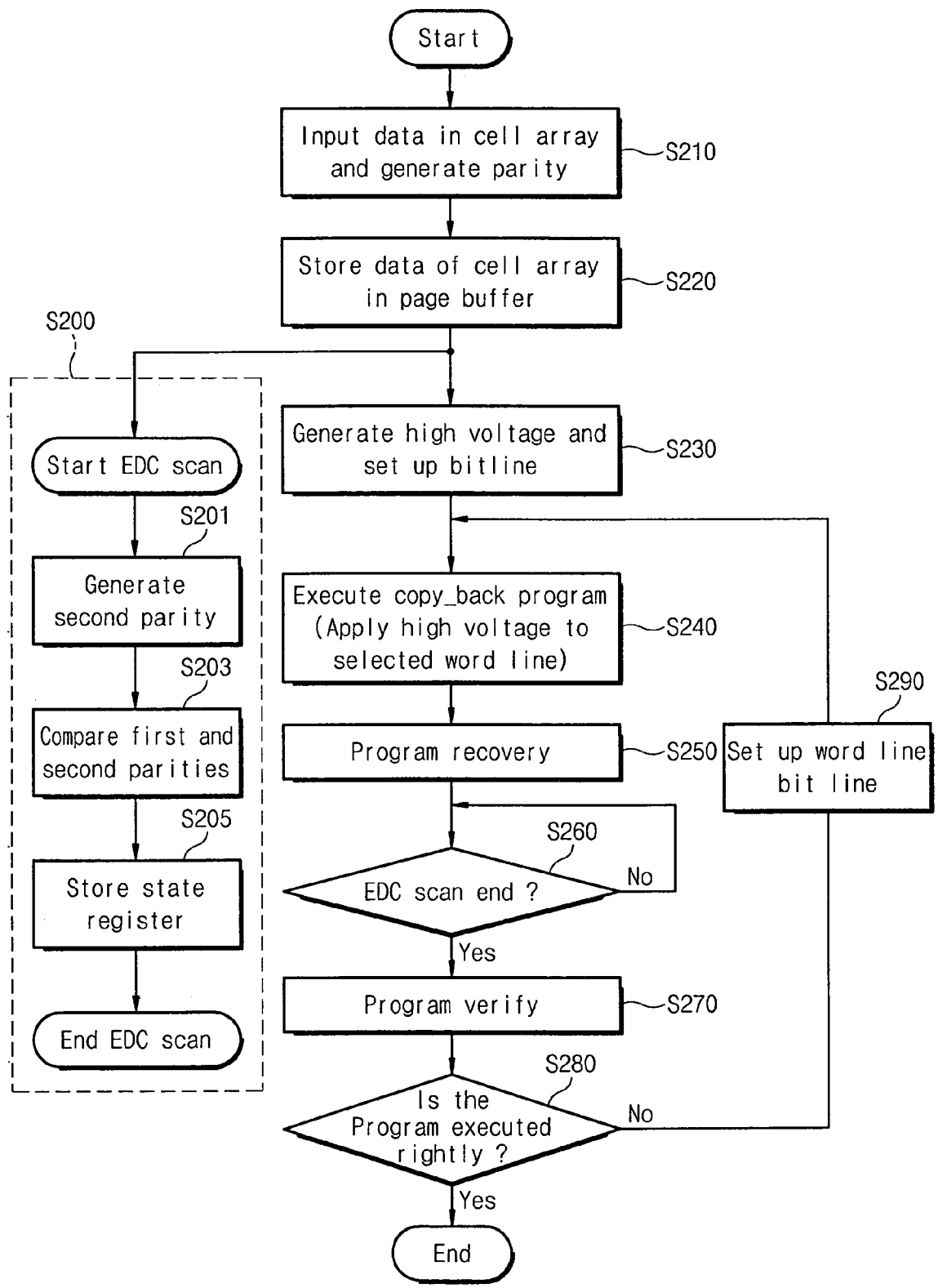
FIG. 2 is a flow chart illustrating an error detection method suitable for use with the NAND flash memory of FIG. 1 in accordance with some embodiments of the invention.

FIG. 2 is a flow chart illustrating an error detection method suitable for use with the NAND flash memory of FIG. 1. in accordance with some embodiments of the invention.

In process S210, data is input in a cell array and a first parity with respect to the data is generated. The first parity is generated while the data is input in the cell array 110 (with reference to FIG. 1). The data is stored in a source page of the cell array 110, and the first parity is stored in a source page of the redundancy cell array 210 (with reference to FIG. 1).

In process S220, the data and the first parity are read, which are stored in source pages of the cell array 110 and the redundancy cell array 210, respectively, and the read data and first parity are stored in the page buffer 120 (in FIG. 1) and the redundancy page buffer 220 (in FIG. 1,). respectively. This is called 'a copyback read operation'. A one-bit error may occur during the copyback read operation.

Next, the data and the first parity that are stored in the page buffer 120 and the redundancy page buffer 220, respectively, are programmed in target pages of the cell array 110 and the redundancy cell array 210. This is called 'copyback program operation'. In FIG. 2, the copyback program operation includes processes S230, S240, and S250.

In process S230, a high voltage is generated and a bit line is setup as a preliminary step for preparing the copyback program operation. In this case, the high voltage is supplied from a high voltage generator circuit (or a charge pump circuit) of the NAND flash memory device as is well known to those skilled in the art, and the generated high voltage is provided for the word line. Setting up the bit line in process S230 means that a program voltage (e.g., 0V) is applied to the bit line.

In process S240, a high voltage (e.g., 15V~20V) is applied to a selected word line to execute the copyback program.

In process S250, a word line and a bit line are initialized to carry out the next operation after the copyback program is executed. This is called a program recovery operation.

Referring to FIG. 2, in process S200 an error detection code scan (EDC scan) operation is performed concurrently with the copyback program operation steps S230, S240, and S250. The EDC scan operation S200 includes processes S201, S203, and S205.

In process S201, the data stored in the page buffer 120 during process S220 is input and a second parity is generated.

In process S203, the first parity stored in the redundancy page buffer 220 during process S220 is compared with the second parity generated in process S201. If the first and second parities are identical, a pass signal Pass is issued. If not, a fail signal is issued. In this case, the issue of the pass signal means that no error occurs during the copyback read operation, and the issue of the fail signal means that an error has occurred.

In process S205, the pass or fail signal generated in process S203 is stored in a state register 181 (in FIG. 1), and the EDC scan operation is ended. The data stored in the state register 181 is externally output through an input/output line.

Referring to FIG. 2 again, the EDC scan operation S200 may be ended before or after the program recovery process S250. However, it is confirmed whether the EDC scan operation is ended after the step of program recovery S250 is ended and before the program verify process S270 is carried out.

In process S260, after the program recovery process S250 is ended, it is confirmed whether the EDC scan operation S200 has ended. If the EDC scan operation is complete, the process proceeds to the next step but if not, the confirming process S260 is repeated until the EDC scan operation is ended.

In process S270, the data stored in the page buffer 120 is scanned to confirm whether the copyback program is executed. This scan operation is called 'program verify operation'. If the data stored in the page buffer 120 is programmed in a target page, the data of the page buffer 120 is changed from '0' to '1'. The program verify operation confirms whether the data '0' exists in the page buffer 120.

In process S280, it is confirmed whether the program is executed correctly. That is, the data stored in the page buffer 120 in process S270 are all varied to "1". If the data of the page buffer 120 are all '1', the copyback operation has ended. However, if the data '0' exists in the page buffer 120, the next process S290 is performed.

In process S290, a word line and a bit line are setup as a preliminary step for executing the copyback program again. That is, a voltage that is slightly greater than the high voltage generated in process S230 is applied to the word line, and a program voltage (e.g., 0V) is applied to the bit line. Then, processes S240 through S280 are carried out repeatedly.

The error detection method of the NAND flash memory device ends the EDC scan operation S200 before the program verify operation S270 that changes the data stored in the page buffer 120 is performed. Otherwise, the second parity generated during the EDC scan operation S200 is changed as the data stored in the page buffer is varied and the EDC scan would become meaningless. According to the error detection method, the EDC scan operation S200 is performed together with the copyback program operation S230, S240, and S250, such that errors occurring during the copyback read operation S220 may be detected without additional time delay.

Figure 3:
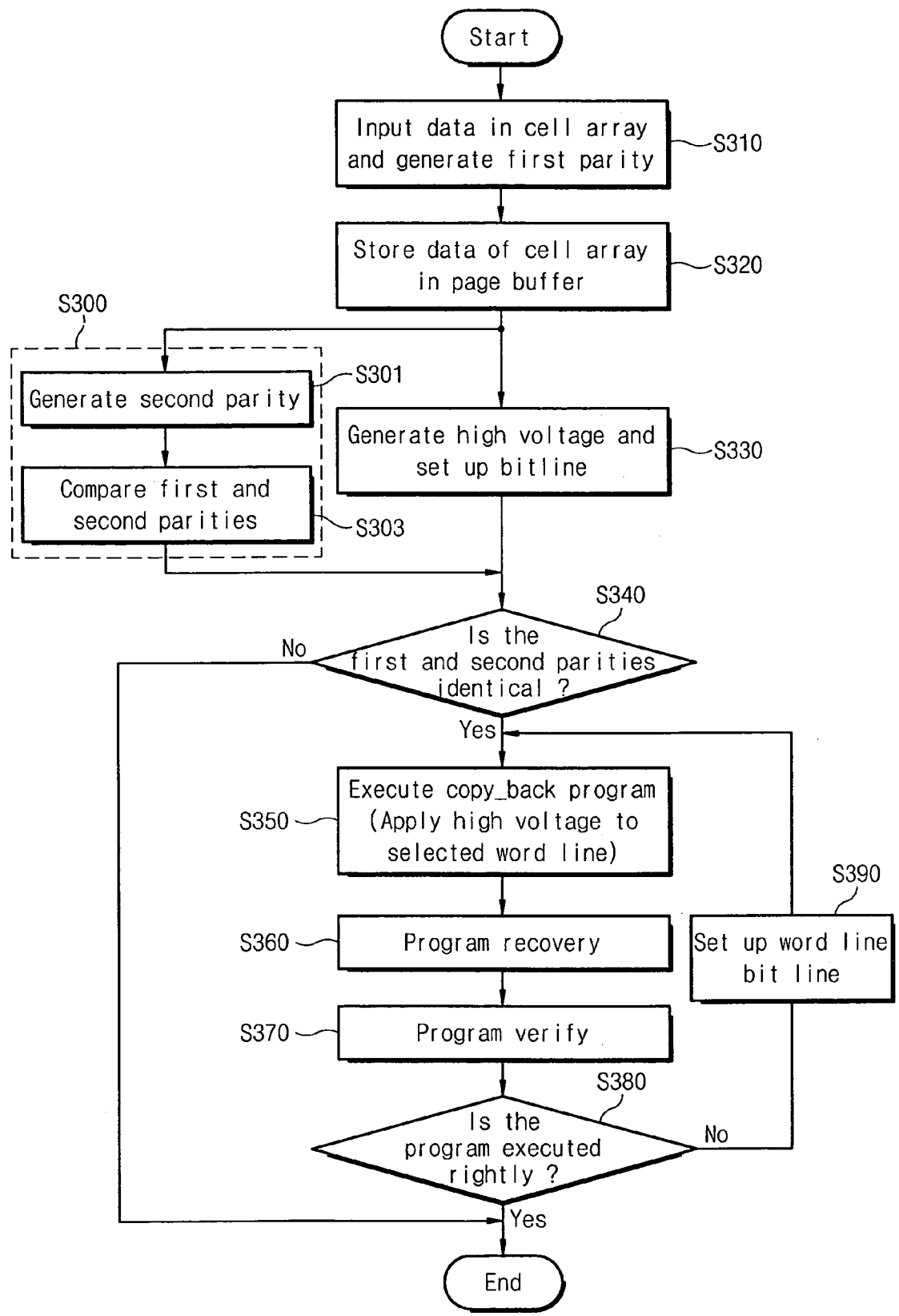
FIG. 3 is a flow chart illustrating a copyback program method suitable for use with the NAND flash memory device of FIG. 1 in accordance with some other embodiments of the invention.

FIG. 3 is a flow chart illustrating a copyback program method suitable for use with the NAND flash memory device of FIG. 1 in accordance with some other embodiments of the invention.

In process S310, data is input to a cell array and a first parity with respect to the data is generated. In process S320, the data and the first parity, which are stored in each source page of the cell array 110 and the redundancy cell array 210, respectively, are read. The read data and first parity are stored in the page buffer 120 (in FIG. 1) and the redundancy page buffer 220 (in FIG. 1), respectively.

Next, the data and the first parity that are respectively stored in the page buffer 120 and the redundancy page buffer 220 are programmed in target pages of the cell array 110 and the redundancy cell array 210. This is called 'a copyback program operation'. In FIG. 3, the copyback program operation includes processes S330, S340, S350, and S360.

In process S301, data stored in a page buffer 120 during process S320 is input into the parity generator 140 and a second parity is generated.

In process S303, a first parity stored in the redundancy page buffer 220 during process S320 is compared with the second parity generated in process S301. If the first and second parities are identical, a pass signal Pass is issued, If not, a fail signal is issued. In this case, the issue of the pass signal means that no error occurs during the copyback read operation, and the issue of the fail signal means that error occurs. The pass or fail signal generated in process S303 is stored in a state register 181 (in FIG. 1).

Referring to FIG. 3 again, the first and second parities are examined in process S340. If the first and second parities are identical, a pass signal Pass is issued and the process proceeds to process S350. However, if the first and second parities are not identical, a fail signal Fail is issued and the copyback operation ends. That is, the copyback program operation is not performed.

In process S350, a high voltage (e.g., 15V~20V) is applied to the selected word line to execute the copyback program.

In process S360, a word line and a bit line are initialized to carry out the next operation after the copyback program is executed. This is called a program recovery operation.

In process S370, the data stored in the page buffer 120 is scanned to confirm whether the copyback program has executed. This scan operation is called a program verify operation. If the data stored in the page buffer 120 is programmed in a target page, the data of the page buffer 120 is varied from '0' to '1'. The program verify operation confirms whether the data '0' exists in the page buffer 120.

In process S380, it is confirmed whether the program has executed rightly. That is, the data stored in the page buffer 120 are all varied to "1" in the process S370. If the data of the page buffer 120 are all '1', the copyback operation has ended. However, if the data "0" exists in the page buffer 120, the next process S390 is performed.

In process S390, a word line and a bit line are set up as a preliminary step for executing the copyback program again. That is, a voltage that is a little greater than the high voltage generated in process S330 is applied to the word line, and a program voltage (e.g., 0V) is applied to the bit line. Then, processes S350 through S380 are carried out repeatedly.

The copyback program method according to embodiments of the invention generates a first parity at a data input and stores the first parity in a redundancy cell array 210. Then, a second parity is generated to detect errors that occur during a copyback read operation and compares it with the first parity. As the result of the comparison, if the first and second parities are identical, the copyback program is normally executed. If not, the copyback program is not executed and the copyback operation ends.

The NAND flash memory device according to embodiments of the invention and the error detection method thereof may detect errors that occur at a copyback read operation without additional time delay by performing an EDC scan during a copyback program.

The NAND flash memory device according to embodiments of the invention and the copyback program method thereof ends the copyback operation without executing the copyback program when errors occur during the copyback operation, such that two-bit errors may be prevented from existing in a target page.

The invention may be practiced in many ways. What follows are exemplary, non-limiting descriptions of some embodiments of the invention.

According to some embodiments, an error detection method for a NAND flash memory device includes reading data stored in a cell array and simultaneously copyback programming the read data along with detecting errors that occurred while reading the data stored in the cell array. In these embodiments, the detection of errors ends before a program verify operation is performed.

According to these embodiments, the error detection method further includes, before reading data stored in the cell array, generating a first parity with respect to the data while the data is stored in the cell array. Furthermore, detecting errors includes generating a second parity from the data stored in the page buffer; comparing the first and second parities and generating a detection signal; and storing the detection signal in a state register.

According to other embodiments of the invention, an error detection method for a NAND flash memory device includes inputting data in a cell array; reading data stored in the cell array and storing the data in a page buffer; simultaneously detecting errors that occurred while reading data along with performing a copyback program operation; confirming whether the detection of errors has ended; and performing a program verify operation.

In these embodiments, the copyback program operation includes generating a high voltage and setting up a bit line; applying the high voltage to a selected word line; and recovering the program.

In these embodiments, inputting data includes generating a first parity with respect to the data stored in the cell array. Furthermore, detecting errors may include generating a second parity from the data stored in the page buffer; comparing the first and second parities and generating a detection signal; and storing the detection signal in a state register. In this case, the detection signal that is stored in the state register may be externally output through an input/output line.

According to some other embodiments of the invention, a NAND flash memory device, includes a cell array configured to store data; a page buffer unit configured to copyback read the data; and an error detector configured to detect errors during a copyback programming operation.

In these embodiments, the NAND flash memory device further includes a control device configured to control the error detector so that error detection ends before a program verify operation is performed.

In these embodiments, the cell array is configured to store a first parity with respect to the data. The error detector includes a parity generator configured to receive the data stored in the page buffer and configured to generate a second parity; and a comparator configured to compare the first and second parities and to generate a detection signal. In addition, a control device controls the parity generator and the comparator to generate the detection signal before a program verify operation is carried out. In this case, the control device includes a state register that is configured to store the detection signal. The detection signal that is stored in the state register may be externally output through an input/output line.

According to other embodiments of the invention, a NAND flash memory device includes a cell array configured to store data and a first parity that is indicative of the data; a page buffer copyback configured to read the data and the first parity; a first parity generator configured to receive the data stored in the page buffer and to generate a second parity in synchronization with a first clock signal during a copyback program operation; a comparator configured to compare the first and second parities and to generate a detection signal in synchronization with a second clock signal; and a control device configured to control the first and second clock signals to generate the detection signal before a program verify operation is performed.

In these embodiments, the cell array includes a main cell array and a redundancy cell array, wherein the main cell array stores the data and the redundancy cell array stores the first parity. The page buffer includes a main page buffer and a redundancy page buffer, wherein the main page buffer copyback is configured to read the data stored in the main cell array and the redundancy page buffer copyback is configured to read the first parity stored in the redundancy cell array.

In these embodiments, the control device includes a state register configured to store the detection signal. The detection signal stored in the state register may be externally output through an input/output line.

According to other embodiments, the NAND flash memory device may further include a second parity generator configured to generate the first parity while the data is input to the cell array.

According to embodiments of the invention, an error detection method for a NAND flash memory device does not require any additional time because the error detection operation is performed concurrently with the copyback program operation.

According to still other embodiments of the invention, a copyback program method for a NAND flash memory device includes reading data stored in a cell array; detecting errors that occur during reading of the stored data; and copyback programming the data that was read from the cell array according to the error detection result. In these embodiments, the copyback program ends when an error is detected.

According to some embodiments, the copyback program method further includes, prior to reading data stored in the cell array, generating a first parity with respect to the data while the data is being input to the cell array. Detecting errors includes generating a second parity from the data stored in the page buffer; generating a detection signal by comparing the first and second parities; and storing the detection signal in a state register. The detection signal that is stored in the state register may be externally output through an input/output line.

In these embodiments, detecting errors is performed concurrently with operations of generating a high voltage and setting up a bit line.

According to still other embodiments of the invention a NAND flash memory device includes a cell array structured to store data; a page buffer copyback structured to read the data; an error detector structured to detect errors that occur during a copyback read operation; and a control device structured to control the page buffer and the error detector to copyback program the data stored in the page buffer in response to the error detection result. The cell array may also store a first parity that is indicative of the data.

In these embodiments, the control device controls the page buffer and the error detector to end the copyback program operation when errors are detected.

The error detector includes a parity generator structured to receive the data stored in the page buffer and to generate a second parity; and a comparator structured to compare the first and second parities and to generate a detection signal. The control device includes a state register structured to store the detection signal. The detection signal stored in the state register may be externally output through an input/output line.

According to other embodiments of the invention, a NAND flash memory device includes a cell array configured to store data and a first parity with respect to the data; a page buffer copyback configured to read the data and the first parity; a first parity generator configured to receive the data stored in the page buffer and to generate a second parity; a comparator configured to compare the first and second parities and to generate a detection signal; and a control device configured to control the page buffer, the first parity generator, and the comparator to copyback program the data stored in the page buffer in response to the detection signal.

In these embodiments, the control device is configured to control the page buffer, the first parity generator, and the comparator such that the copyback program operation ends when the detection signal is a fail signal.

In these embodiments, the cell array includes a main cell array and a redundancy cell array, wherein the main cell array is configured to store the data and the redundancy cell array is configured to store the first parity. The page buffer includes a main page buffer and a redundancy page buffer, wherein the main page buffer copyback is configured to read the data stored in the main cell array and the redundancy page buffer copyback is configured to read the first parity stored in the redundancy cell array.

In these embodiments, the control device includes a state register storing the detection signal. The detection signal stored in the state register may be externally output through an input/output line.

According to other embodiments, the NAND flash memory device may further include a second parity generator configured to generate the first parity while the data is input in the cell array.

The NAND flash memory device and the copyback program method thereof may prevent two-bit error from existing in one page by ending the copyback program operation when error occurs during a copyback operation.

Although the invention has been described in connection with certain exemplary embodiments that were illustrated in the accompanying drawings, the inventive principles are not limited only to the described embodiments. It will be apparent to those skilled in the art that various substitutions, modifications, and changes may be made to the above embodiments without departing from the scope and spirit of the invention as defined by the attached claims.

I claim:

1. An error detection method for a NAND flash memory device comprising:
   reading data stored in a cell array of the flash memory device; and
   detecting errors that occur during the reading of the data concurrently with copyback programming of the read data;
   wherein the flash memory device including the cell array is fabricated on a semiconductor chip;
   wherein detecting the errors is performed internally in the flash memory device on the semiconductor chip; and
   wherein detecting errors ends before a program verify operation is performed.

2. The method of claim 1, further comprising storing the data read from the cell array in a page buffer.

3. The method of claim 2, further comprising, before reading the data, generating a first parity for the data while the data is stored in the cell array.

4. The method of claim 3, wherein detecting errors comprises:
   generating a second parity from the data stored in the page buffer; and
   comparing the first and second parities to generate a detection signal.

5. The method of claim 4, further comprising storing the detection signal in a state register.

6. The method of claim 5, further comprising externally outputting the detection signal stored in the state register through an input/output line.

7. An error detection method for a NAND flash memory device comprising:
   inputting data in a cell array of the flash memory device;
   reading data from the cell array and storing the data in a page buffer;
   detecting errors that occurred while reading data from the cell array and storing the data in the page buffer while concurrently performing a copyback program operation;
   confirming whether detecting errors has ended; and
   performing a program verify operation;
   wherein the flash memory device including the cell array and page buffer is fabricated on a semiconductor chip; and
   wherein detecting the errors is performed internally in the flash memory device on the semiconductor chip.

8. An error detection method for a NAND flash memory device comprising:
   inputting data in a cell array of the flash memory device;
   reading data from the cell array and storing the data in a page buffer;
   detecting errors that occurred while reading data from the cell array and storing the data in the page buffer while concurrently performing a copyback program operation;
   confirming whether detecting errors has ended; and
   performing a program verify operation;
   wherein detecting the errors is performed internally in the flash memory device; and
   wherein performing the copyback program operation comprises:
      generating a high voltage and setting up a bit line;
      applying the high voltage to a selected word line; and
      recovering after the copyback program operation.

9. The method of claim 7, wherein inputting data in the cell array comprises generating a first parity for the data stored in the cell array.

10. The method of claim 9, wherein detecting errors comprises: generating a second parity from the data stored in the page buffer; and comparing the first and second parities to generate a detection signal.

11. The method of claim 10, further comprising: storing the detection signal in a state register.

12. The method of claim 11, further comprising externally outputting the detection signal that is stored in the state register through an input/output line.

13. A NAND flash memory device comprising:
   a cell array configured to store data;
   a page buffer configured to copyback read the data;
   an error detector configured to detect errors during a copyback program operation; and
   a control device configured to control the error detector such that error detection ends before a program verify operation is performed;
   wherein the cell array, page buffer and error detector are fabricated on the same semiconductor chip.

14. The device of claim 13, wherein the cell array is configured to store a first parity for the data.

15. The device of claim 14, wherein the error detector comprises:
   a parity generator configured to receive the data stored in the page buffer and to generate a second parity; and a comparator configured to compare the first and second parities and to generate a detection signal.

16. The device of claim 15, further comprising a control device configured to control the parity generator and the comparator to generate the detection signal before a program verify operation begins.

17. The device of claim 16, wherein the control device includes a state register configured to store the detection signal.

18. The device of claim 17, further comprising an input/output line configured to externally output the detection signal that is stored in the state register.

19. A NAND flash memory device comprising:
a cell array structured to store data and a first parity for the data;
a page buffer structured to copyback read the data and the first parity;
a first parity generator structured to receive the data stored in the page buffer and to generate a second parity in synchronization with a first clock signal during a copyback program operation;
a comparator that is structured to compare the first and second parities and to generate a detection signal in synchronization with a second clock signal; and
a control device structured to control the first and second clock signals and to generate the detection signal before a program verify operation begins.

20. The device of claim 19, wherein the cell array comprises:
a main cell array that stores the data; and
a redundancy cell array that stores the first parity.

21. The device of claim 20, wherein the page buffer comprises:
a main page buffer structured to copyback read the data stored in the main cell array; and
a redundancy page buffer structured to copyback read the first parity stored in the redundancy cell array.

22. The device of claim 19, wherein the control device comprises a state register structured to store the detection signal.

23. The device of claim 22, further comprising an input/output line structured to externally output the detection signal stored in the state register.

24. The device of claim 19, further comprising a second parity generator structured to generate the first parity while the data is being input in the cell array.

25. A copyback program method for a NAND flash memory device comprising:
reading data stored in a cell array of the flash memory device;
detecting errors that occur during reading of the data;
copyback programming the data read from the cell array according to a result of detecting errors; and
generating a high voltage and setting up a bit line concurrently with detecting errors.

26. The method of claim 25, wherein copyback programming the data read from the cell array comprises ending the copyback programming when the result indicates an error was detected.

27. The method of claim 25, further comprising storing the data read from the cell array in a page buffer.

28. The method of claim 27, further comprising, prior to reading data stored in the cell array, generating a first parity for the data while the data is being input into the cell array.

29. The method of claim 28, wherein detecting errors comprises:
generating a second parity for the data stored in the page buffer;
comparing the first and second parities; and
generating a detection signal based on a result of the comparison of the first and second parities.

30. The method of claim 29, further comprising storing the detection signal in a state register.

31. The method of claim 30, further comprising externally outputting the detection signal stored in the state register through an input/output line.

32. The method of claim 25, wherein copyback programming comprises:
applying the high voltage to a selected word line; and
recovering after the copyback program operation.

33. A NAND flash memory device comprising:
a cell array configured to store data;
a page buffer configured to copyback read the data;
an error detector configured to detect errors that occur during a copyback read operation;
a control device responsive to the error detector and configured to control the page buffer and the error detector to copyback program the data stored in the page buffer; and
a high voltage generator circuit configured to set up a bit line concurrently with detecting errors.

34. The device of claim 33, wherein the control device is configured to control the page buffer and the error detector to end the copyback program operation when the error detector detects an error.

35. The device of claim 33, wherein the cell array is configured to store a first parity for the data.

36. The device of claim 35, wherein the error detector comprises:
a parity generator configured to receive the data stored in the page buffer and to generate a second parity; and
a comparator configured to compare the first and second parities and to generate a detection signal.

37. The device of claim 36, wherein the control device comprises a state register configured to store the detection signal.

38. The device of claim 37, further comprising an input/output line configured to externally output the detection signal stored in the state register.

39. A NAND flash memory device comprising:
a cell array configured to store data and a first parity for the data;
a page buffer configured to copyback read the data and the first parity;
a first parity generator configured to receive the data stored in the page buffer and to generate a second parity;
a comparator configured to compare the first and second parities and to generate a detection signal; and
a control device configured to control the page buffer, the first parity generator, and the comparator to copyback program the data stored in the page buffer in response to the detection signal;
wherein the cell array comprises:
a main cell array configured to store the data; and
a redundancy cell array configured to store the first parity.

40. The device of claim 39, the control device configured to control the page buffer, the first parity generator, and the comparator to end the copyback program operation when the detection signal is a fail signal.

41. The device of claim 39, wherein the page buffer comprises:
   a main page buffer configured to copyback read the data stored in the main cell array; and
   a redundancy page buffer configured to copyback read the first parity stored in the redundancy cell array.

42. The device of claim 39, wherein the control device comprises a state register configured to store the detection signal.

43. The device of claim 42, further comprising an input/output line configured to externally output the detection signal stored in the state register.

44. A NAND flash memory device comprising:
   a cell array configured to store data and a first parity for the data;
   a page buffer configured to copyback read the data and the first parity;
   a first parity generator configured to receive the data stored in the page buffer and to generate a second parity;
   a comparator configured to compare the first and second parities and to generate a detection signal;
   a control device configured to control the page buffer, the first parity generator, and the comparator to copyback program the data stored in the page buffer in response to the detection signal; and
   a second parity generator configured to generate the first parity while the data is input into the cell array.

* * * * *